United States Patent
Hoang et al.

(10) Patent No.: US 7,242,221 B1
(45) Date of Patent: Jul. 10, 2007

(54) SELECTABLE INVERSION OF DIFFERENTIAL INPUT AND/OR OUTPUT PINS IN PROGRAMMABLE LOGIC DEVICES

(75) Inventors: Tim T Hoang, San Jose, CA (US); Sergey Y Shumarayev, San Leandro, CA (US); Wilson Wong, San Francisco, CA (US); Simardeep Maangat, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 67 days.

(21) Appl. No.: 11/056,442

(22) Filed: Feb. 11, 2005

(51) Int. Cl.
*H03K 19/0175* (2006.01)

(52) U.S. Cl. .......................................... 326/82; 326/38

(58) Field of Classification Search ............ 326/37–41, 326/82, 83
See application file for complete search history.

(56) References Cited

U.S. PATENT DOCUMENTS

| 6,650,140 | B2 | 11/2003 | Lee et al. |
| 6,724,328 | B1 | 4/2004 | Lui et al. |
| 6,750,675 | B2 | 6/2004 | Venkata et al. |
| 6,825,698 | B2 * | 11/2004 | Wang et al. ............... 327/108 |
| 6,854,044 | B1 | 2/2005 | Venkata et al. |
| 2001/0033188 | A1 | 10/2001 | Aung et al. |

* cited by examiner

*Primary Examiner*—Don Le
(74) *Attorney, Agent, or Firm*—Fish & Neave IP Group Ropes & Gray LLP; Robert R. Jackson

(57) ABSTRACT

Programmable logic device circuitry for receiving and/or transmitting a differential signal includes controllable invert circuitry that effectively reverses the polarity of the differential signal. The controllable invert circuitry operates on a single-ended (non-differential) signal that has either been derived from a differential input signal or from which a differential output signal will be derived.

18 Claims, 3 Drawing Sheets

SELECTABLE INVERSION OF DIFFERENTIAL INPUT AND/OR OUTPUT PINS IN PROGRAMMABLE LOGIC DEVICES

BACKGROUND OF THE INVENTION

This invention relates to programmable logic devices ("PLDs") such as those sometimes known as field programmable gate arrays ("FPGAs"). More particularly, the invention relates to input and/or output circuitry for differential signaling by such devices.

Differential signaling is increasingly of interest for use in interconnecting various devices in electronic systems. For example, such signaling may be used for high-speed serial communication between two or more integrated circuit devices on a printed circuit board.

It can happen in such uses of differential signaling that the polarities of the two differential input or output pins on one of the devices are reversed relative to what they are supposed to be. This can happen, for example, as a result of an error or misunderstanding in the design or fabrication of the device, or in the design or fabrication of the printed circuit board on which the devices are mounted. Even if there is no such error or misunderstanding, there can be situations in which it would be desirable to be able to reverse the polarity of a device's differential signaling input and/or output pins. For example, this could help to simplify the pattern of printed circuit board wiring traces connecting two or more devices on the printed circuit board.

SUMMARY OF THE INVENTION

In accordance with this invention, programmable logic device circuitry (such as an FPGA) that receives and/or transmits a differential signal includes controllable invert circuitry that can be used to effectively reverse the polarity of the differential signal. The controllable invert circuitry operates on a single-ended (non-differential) signal that has either been derived from a differential input signal or from which a differential output signal will be derived.

Further features of the invention, its nature and various advantages, will be more apparent from the accompanying drawings and the following detailed description of the preferred embodiments.

DETAILED DESCRIPTION

Figure 1:
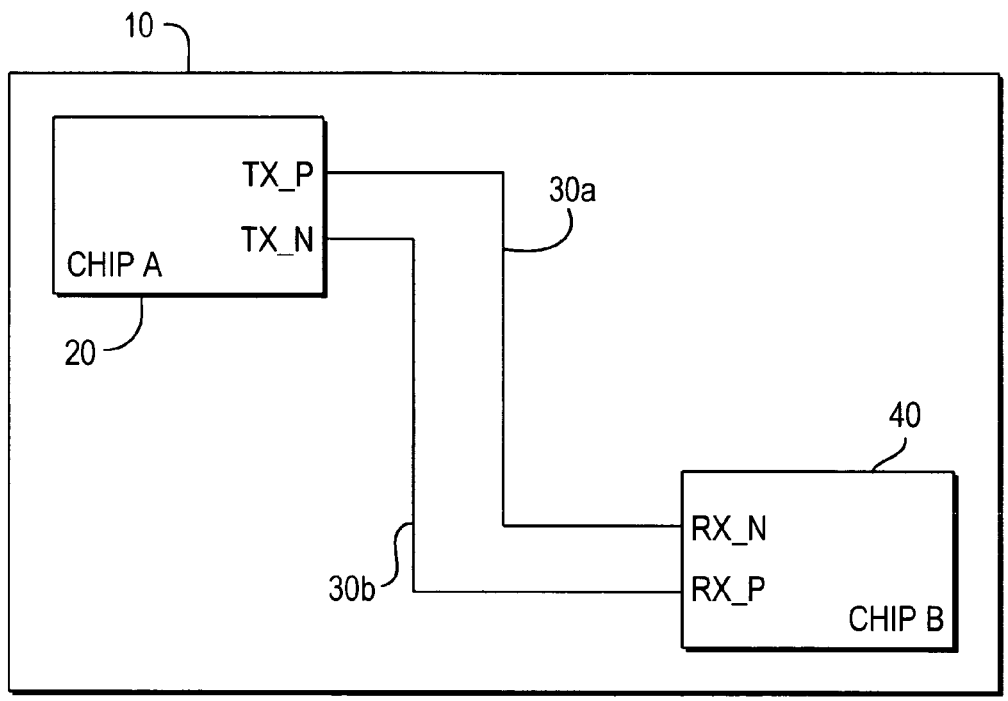
FIG. 1 is a simplified block diagram of an illustrative prior art system that is useful in explaining potential applications of the invention.

FIG. 1 shows an illustrative printed circuit board ("PCB") 10 on which are mounted two integrated circuit devices 20 and 30 (also labeled "Chip A" and "Chip B", respectively). PCB 20 has differential output pins TX_P and TX_N for outputting a pair of differential signals to a pair of PCB signal or circuit traces 30a and 30b on PCB 10. As is typical for differential signaling, this pair of signals actually represents only a single piece (e.g., bit) of information at any one time. For example, logic 1 may be represented by signal TX_P having a relatively high voltage or potential, concurrently with signal TX_N having a relatively low voltage or potential. Conversely, logic 0 may be represented by signal TX_N having a relatively high voltage or potential, concurrently with signal TX_P having a relatively low voltage or potential. As an alternative to potential differences as described in the two preceding sentences, the direction of current flow through pins TX_P and TX_N can be used for differential signaling (e.g., current out through TX_P and in through TX_N may represent logic 1, and current in through TX_P and out through TX_N may represent logic 0). This invention applies to any mode of differential signaling. Because a differential signal pair represents only one item of information at any given time, the two signals of a differential pair may sometimes be referred to herein simply as a differential signal.

Signal traces 30a and 30b convey the differential output signals of device 20 to differential input pins RX_N and RX_P of device 40. In order for the system to operate properly, the signal from TX_P of device 20 should be connected to RX_P of device 40, and the signal from TX_N of device 20 should be connected to RX_N of device 40. In FIG. 1, however, possibly as a result of some error or misunderstanding in designing or fabricating at least one of components 10, 20, and 40, TX_P is erroneously connected to RX_N, and TX_N is erroneously connected to RX_P. As a consequence, devices 20 and 40 cannot communicate with one another properly, and the FIG. 1 system will probably not operate as intended, if at all.

Figure 2:
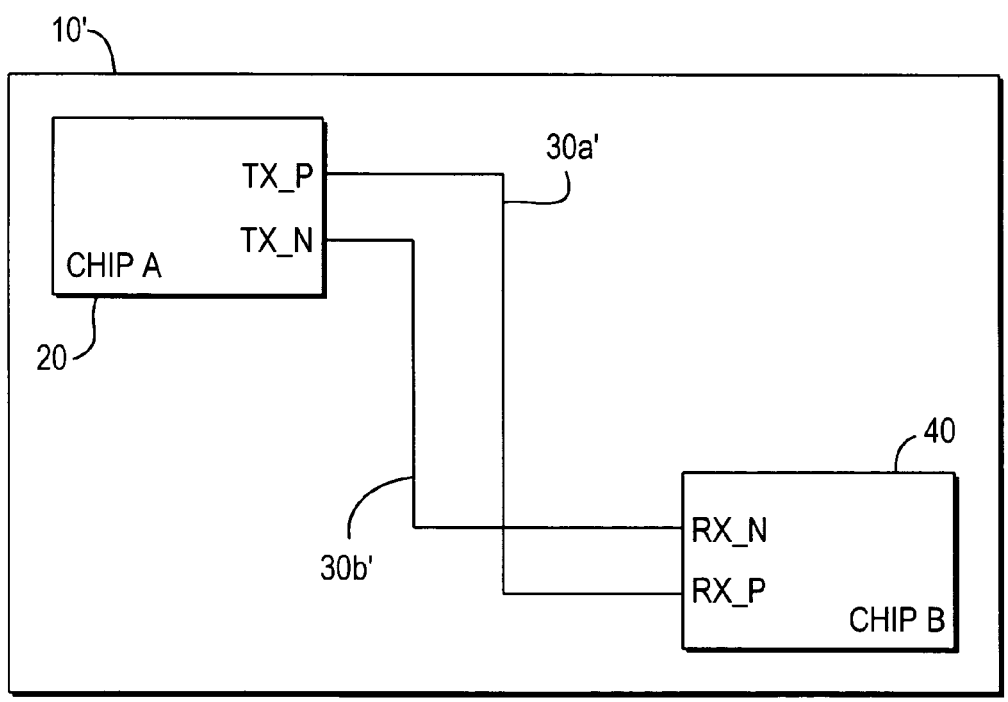
FIG. 2 shows a possible conventional modification of the FIG. 1 system.

FIG. 2 shows a possible prior art solution to a problem of the type illustrated by FIG. 1. In FIG. 2 the PCB, now labeled 10', has been redesigned to route circuit traces 30 differently than in FIG. 1. In particular, FIG. 2 circuit trace 30a' has been re-routed to connect TX_P to RX_P, and circuit trace 30b' has been re-routed to connect TX_N to RX_N. Devices 20 and 40 are now able to communicate properly, enabling the system to operate as intended.

Another prior art way the problem illustrated by FIG. 1 could be resolved would be by redesigning one of devices 20 and 40 to swap the locations of the two pins used for the differential signaling.

All of the above prior art ways of remedying the FIG. 1 problem are potentially costly and otherwise disadvantageous due to probable delay in completion and delivery of working systems.

If one or both of devices is an FPGA constructed in accordance with this invention, the above-described cost and delay of remedying a problem of the type illustrated by FIG. 1 can be largely or completely eliminated.

Figure 3:
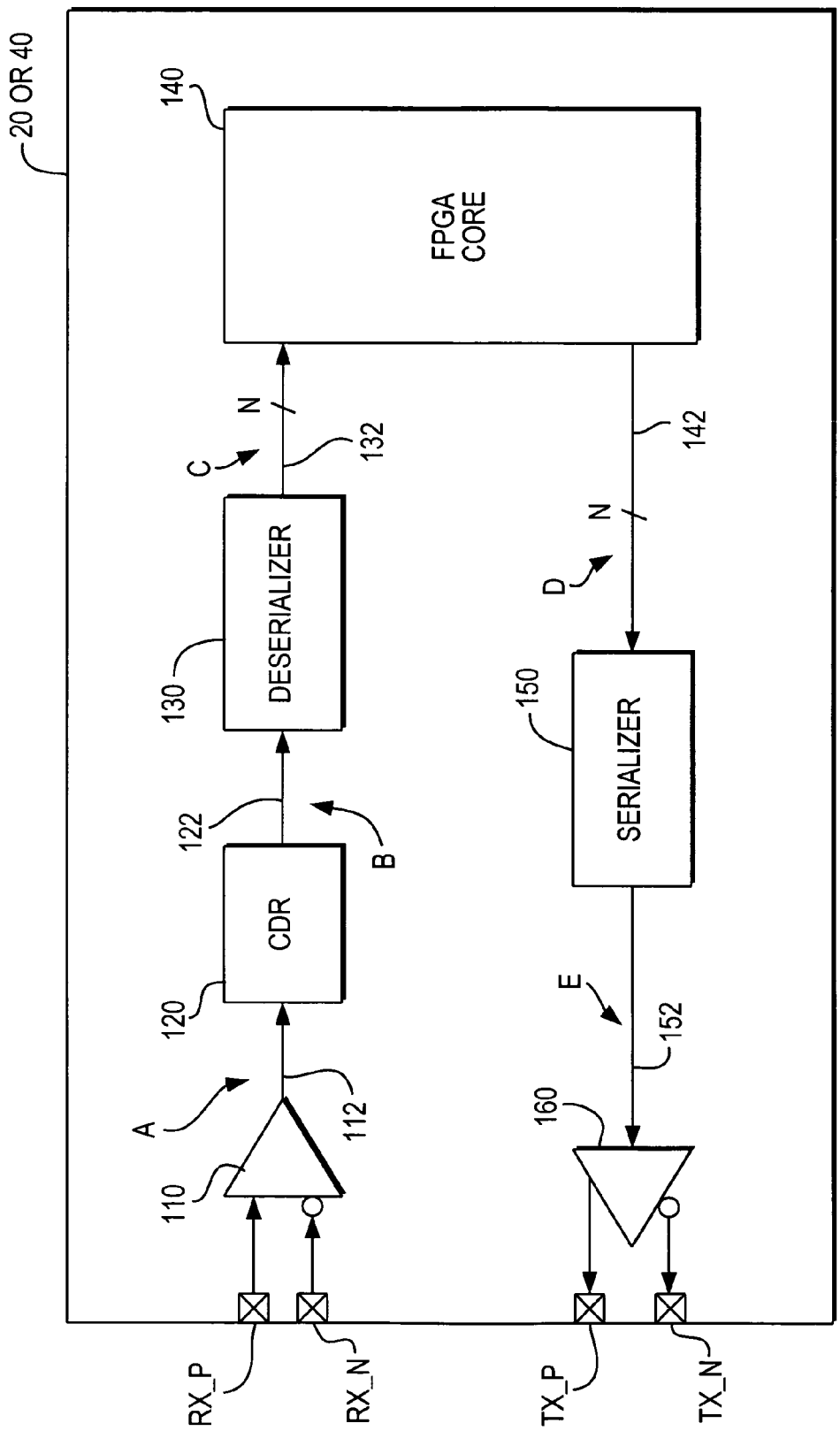
FIG. 3 is a simplified schematic block diagram of illustrative circuitry that can be constructed in accordance with the invention.

FIG. 3 shows an illustrative FPGA construction of device 20 or 40 in accordance with the invention. The basic circuitry shown in FIG. 3 can be similar to that shown in any of a number of prior patents and patent applications such as Aung et al. U.S. patent application Ser. No. 09/805,843, filed Mar. 13, 2001, Lee et al. U.S. patent application Ser. No. 10/059,014, filed Jan. 29, 2002, Lee et al. U.S. Pat. No. 6,650,140, Venkata et al. U.S. Pat. No. 6,750,675, Venkata et al. U.S. patent application Ser. No. 10/317,262, filed Dec. 10, 2002, and Lui et al. U.S. Pat. No. 6,724,328. Because this basic circuitry is thus known, the description of it herein can be somewhat abbreviated.

Differential input buffer circuitry 110 receives a pair of differential input signals from a pair of device input pins that are nominally labeled RX_P and RX_N, respectively. Buffer 110 converts the differential signals it thus receives to a so-called "single-ended" (non-differential) signal on lead 112. A single-ended or non-differential signal is a signal that indicates by its level (voltage or potential) the logical state of the information represented by the related differential signal pair.

Clock data recovery ("CDR") circuitry 120 typically uses a reference clock signal (not shown) to recover data from the signal on lead 112 and to retime that data for further propagation via lead 122.

Deserializer circuitry 130 assembles several successive bits of retimed serial data on lead 122 into a group (nibble, byte, word, or the like) of parallel bits for further propagation via parallel leads 132. FIG. 3 shows that there are N parallel leads 132.

The signals on leads 132 are applied to FPGA core circuitry 140 (e.g., for substantive use by device 20 or 40).

FPGA core 140 may output data signals in parallel via N parallel leads 142.

Serializer circuitry 150 converts these parallel signals to a single serial bit stream on lead 152.

Differential output driver circuitry 160 converts the single-ended (non-differential) serial data signal on lead 152 to a pair of differential output signals. These differential output signals are respectively applied to a pair of device output pins that are nominally labeled TX_P and TX_N.

Circuitry of the type shown in FIG. 3 (other than FPGA core 140) is sometimes known as SERDES (serializer/deserializer) circuitry.

In accordance with the present invention, controllable invert circuitry can be included in the FIG. 3 circuitry at any one of the points labeled A-C and/or at either of the points labeled D and E.

Figure 4:
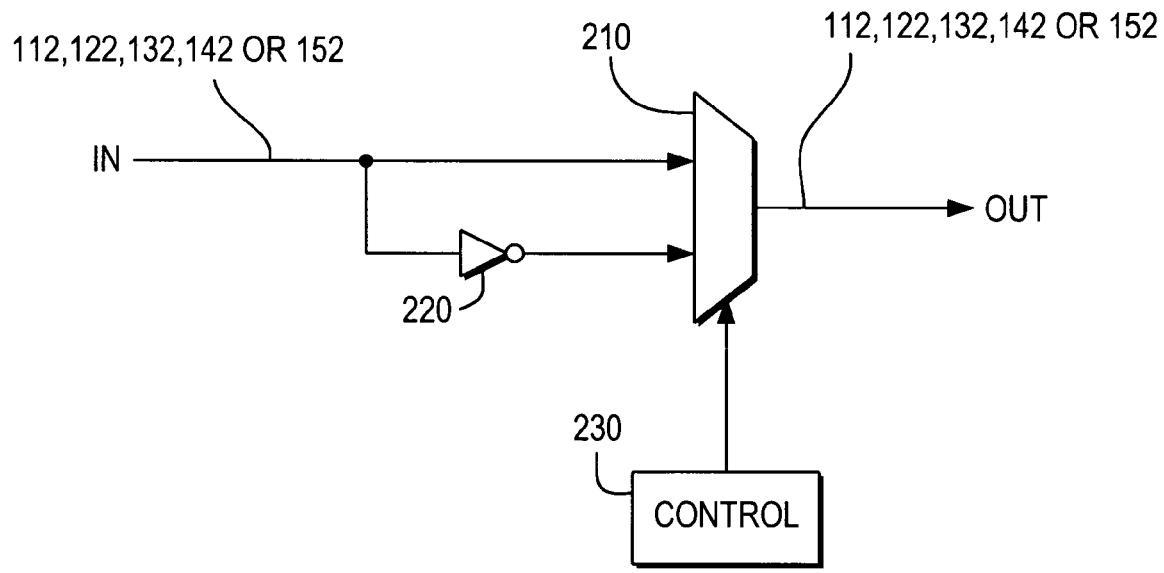
FIG. 4 is a simplified schematic block diagram of an illustrative embodiment of circuitry that can be included in the FIG. 3 circuitry in accordance with the invention.

An illustrative embodiment of controllable invert circuitry 200 that can be included at points A-E as described in the preceding paragraph is shown in FIG. 4. This circuitry 200 includes a two-to-one multiplexer ("mux") 210 that is controlled by control circuitry 230. One of the selectable inputs to mux 210 is the data input signal IN to the controllable invert circuitry. The other selectable input to mux 210 is the data input signal IN after logical inversion by inverter 220. The output signal of control circuitry 230 determines which of the two selectable inputs to mux 210 that device selects as its data output signal OUT. For example, if the output signal for control circuitry 230 is logic 0, mux 210 may select IN as its output signal OUT. Continuing with this example, if the output signal of control circuitry 230 is logic 1, mux 210 selects the output of inverter 220 (i.e., the inverse or complement of IN) as its output signal OUT.

If controllable invert circuitry 200 is used at a point such as A, B, or E in FIG. 3 where there is only one serial data signal, then only a single instance of the elements shown in FIG. 4 is needed at each such location. If circuitry 200 is used at a point such as C or D in FIG. 3 where there are several data signals in parallel, then one instance of each of elements 210 and 220 is needed in each of the parallel data leads. However, one control circuit 230 can provide common control for all of the muxes 210 in all of such parallel data leads.

Figure 5:
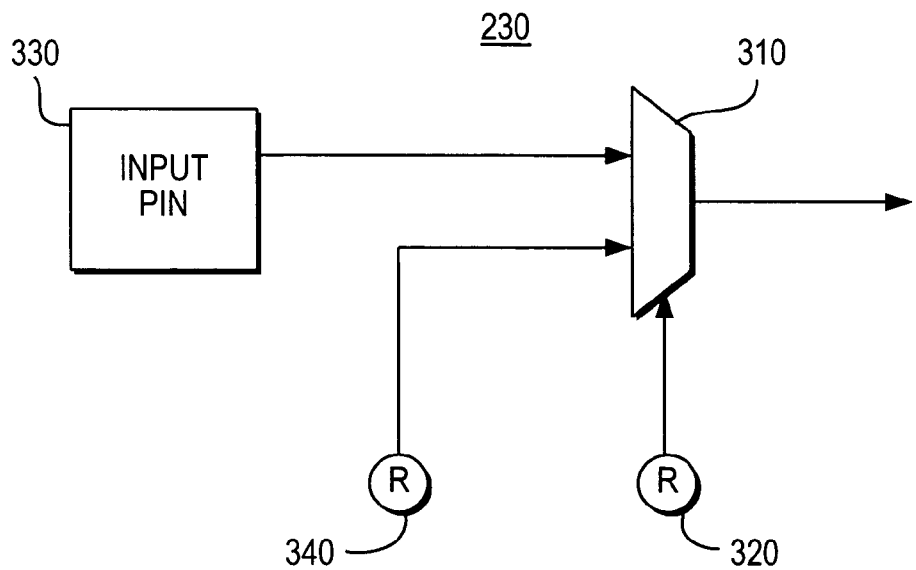
FIG. 5 is a simplified schematic block diagram of an illustrative embodiment of a portion of the FIG. 4 circuitry in accordance with the invention.

An illustrative embodiment of control circuitry 230 is shown in more detail in FIG. 5. This circuitry includes mux 310, programmable memory (e.g., RAM) cells 320 and 340, and a device input pin 330. Mux 310 can select either the signal from the input pin 330 or the signal from RAM cell 340 as the mux output signal. The mux output signal is the output signal of control circuitry 230 (i.e., the control signal applied to mux 210 in FIG. 4). Mux 310 is controlled to make this signal selection by the output signal of programmable RAM cell 320. The signal applied to input pin 330 can be a static or dynamic signal applied to the device 20 or 40 (FIG. 3) that includes circuitry 230. The output signal of RAM cell 340 is a static but programmably selectable signal (by virtue of the programmability of RAM cell 340). Circuitry 230 (constructed as shown in FIG. 5) thus allows controllable invert circuitry 210 to be controlled by either a programmable RAM cell 340 or by an input signal 330 to the device that includes that circuitry. Once again, the choice of which type of control is employed is made by how RAM cell 320 is programmed.

Returning to FIG. 3, it will now be seen that if input connections to RX_P and RX_N have the correct polarity, then it is not necessary for any controllable invert circuitry 200 that has been included at any one of points A-C to invert the signal(s) on the associated lead(s) 112, 122, or 132. However, if the input connections to RX_P and RX_N are reversed (incorrect polarity), this can be corrected by using the controllable invert circuitry 200 that has been included at any one of points A-C to invert the signal(s) on the associated lead(s) 112, 122, or 132.

Similar to what is said in the preceding paragraph, if output connections to TX_P and TX_N have the correct polarity, then it is not necessary for any controllable invert circuitry 200 that has been included at either of points D and E to invert the signal(s) on the associated lead(s) 142 or 152. However, if the output connections to TX_P and TX_N are reversed (incorrect polarity), this can be corrected by using the controllable invert circuitry that has been included at either of points D and E to invert the signal(s) on the associated lead(s) 142 and 152.

It will be understood that the foregoing is only illustrative of the principles of the invention and that various modifications can be made by those skilled in the art without departing from the scope and spirit of the invention. For example, although the invention has been illustrated in the context of its application to differential data signal handling, it will be understood that the invention is equally applicable to handling other types of differential signals such as differential clock signals. As another example of modifications within the scope of the invention, all of the above-described options regarding control of the controllable invert circuitry do not have to be included in all embodiments of the invention. For example, mux 210 in FIG. 4 can be directly controlled by a programmable RAM cell, eliminating the alternative of control from an input pin like 330 in FIG. 5. Or mux 210 in FIG. 4 could be directly controlled from an input pin like 330, eliminating the alternative of control from a programmable RAM cell (like 340 in FIG. 5). It is not necessary for an FPGA constructed in accordance with the invention to have both differential input circuitry and differential output circuitry. Only one of these types of circuitry may be present. Controllable invert circuitry can be constructed differently than is illustratively shown herein. For example, an EXCLUSIVE OR ("XOR") gate can be used to provide controllable inversion of a signal. An FPGA in accordance with the invention can have more types of circuit elements than those shown in FIG. 3, and some of these additional circuit elements can be included in the SERDES portion of the device. The references mentioned earlier in this specification show examples of other types of circuit elements that can be included if desired.

The invention claimed is:

1. Input circuitry for a programmable logic device comprising:
   a pair of input pins for receiving a differential input signal;
   input buffer circuitry for converting the differential input signal to a single-ended signal; and
   controllable invert circuitry downstream from the input buffer circuitry for producing a signal that is a selective inversion of information represented by the single-ended signal.

2. The circuitry defined in claim 1 further comprising:
   programmable logic device core circuitry for receiving a signal including information from the selective inversion.

3. The circuitry defined in claim 1 further comprising:
   CDR circuitry downstream from the input buffer circuitry, and wherein the controllable invert circuitry is connected in circuit relationship between the input buffer circuitry and the CDR circuitry.

4. The circuitry defined in claim 1 further comprising:
   CDR circuitry downstream from the input buffer circuitry, and wherein the controllable invert circuitry is downstream from the CDR circuitry.

5. The circuitry defined in claim 4 further comprising:
   deserializer circuitry downstream from the CDR circuitry, and wherein the controllable invert circuitry is connected in circuit relationship between the CDR circuitry and the deserializer circuitry.

6. The circuitry defined in claim 4 further comprising:
   deserializer circuitry downstream from the CDR circuitry, and wherein the controllable invert circuitry is downstream from the deserializer circuitry.

7. The circuitry defined in claim 1 further comprising:
   a programmable memory cell for controlling operation of the controllable invert circuitry.

8. The circuitry defined in claim 1 further comprising:
   a control signal input pin for receiving a control input signal for controlling operation of the controllable invert circuitry.

9. The circuitry defined in claim 1 further comprising:
   a programmable memory cell;
   a control signal input pin; and
   programmable selection circuitry that can select either the programmable memory cell or the control signal input pin as the source of a signal for controlling the controllable invert circuitry.

10. Output circuitry for a programmable logic device comprising:
    a pair of output pins for outputting a differential output signal;
    output driver circuitry for converting a single-ended signal to the differential output signal; and
    controllable invert circuitry upstream from the output driver circuitry for selectively inverting an applied signal to produce information represented by the single-ended signal.

11. The circuitry defined in claim 10 further comprising:
    programmable logic device core circuitry for producing a signal including information for selective inversion by the controllable invert circuitry.

12. The circuitry defined in claim 10 further comprising:
    serializer circuitry upstream from the output driver circuitry, and wherein the controllable invert circuitry is connected in circuit relationship between the serializer circuitry and the output driver circuitry.

13. The circuitry defined in claim 10 further comprising:
    serializer circuitry upstream from the output driver circuitry, and wherein the controllable invert circuitry is upstream from the serializer circuitry.

14. The circuitry defined in claim 10 further comprising:
    a programmable memory cell for controlling operation of the controllable invert circuitry.

15. The circuitry defined in claim 10 further comprising:
    a control signal input pin for receiving a control input signal for controlling operation of the controllable input circuitry.

16. The circuitry defined in claim 10 further comprising:
    a programmable memory cell;
    a control signal input pin; and
    programmable selection circuitry that can select either the programmable memory cell or the control signal for controlling the controllable invert circuitry.

17. An FPGA comprising:
    a pair of input pins for receiving a differential input signal;
    input buffer circuitry for converting the differential input signal to a single-ended signal;
    CDR circuitry downstream from the input buffer circuitry;
    deserializer circuitry downstream from the CDR circuitry;
    FPGA core circuitry downstream from the deserializer circuitry;
    serializer circuitry downstream from the FPGA circuitry;
    output driver circuitry downstream from the serializer circuitry for converting a single-ended signal applied to the output driver circuitry to a differential output signal;
    a pair of output pins for transmitting the differential output signal; and
    controllable invert circuitry connected in circuit relation at a location selected from (a) between the input buffer circuitry and the CDR circuitry, (b) between the CDR circuitry and the deserializer circuitry, (c) between the deserializer circuitry and the FPGA core circuitry, (d) between the FPGA core circuitry and the serializer circuitry, and (e) between the serializer circuitry and the output driver circuitry, for selectively inverting a signal at the location of the controllable invert circuitry.

18. The FPGA defined in claim 17 further comprising:
    a programmable memory cell;
    a control signal input pin; and
    programmable selection circuitry that can select either the programmable memory cell or the control signal input pin as the source of a signal for controlling the controllable invert circuitry.

* * * * *